United States Patent
Hajnal et al.

(10) Patent No.: US 6,380,741 B1
(45) Date of Patent: Apr. 30, 2002

(54) MAGNETIC RESONANCE IMAGING

(75) Inventors: Joseph Vilmos Hajnal; David James Larkman, both of London; David Jonathan Herlihy, Wallingford, all of (GB)

(73) Assignee: Marconi Medical Systems, Inc., Cleveland, OH (US)

( * ) Notice: Subject to any disclaimer, the term of this patent is extended or adjusted under 35 U.S.C. 154(b) by 0 days.

(21) Appl. No.: 09/713,646

(22) Filed: Nov. 15, 2000

(30) Foreign Application Priority Data

Nov. 15, 1999 (GB) .............................. 9926923

(51) Int. Cl.⁷ ................................ G01V 3/00
(52) U.S. Cl. ...................... 324/318; 324/307
(58) Field of Search .................... 324/307, 309, 324/306, 312, 314, 318, 322

(56) References Cited

U.S. PATENT DOCUMENTS 4,816,765 A * 3/1989 Boskamp .................... 324/318
5,208,534 A * 5/1993 Okamoto et al. ........... 324/309
5,471,142 A * 11/1995 Wang ........................ 324/318

FOREIGN PATENT DOCUMENTS

WO    WO 99/54746    10/1999

\* cited by examiner

Primary Examiner—Louis Arana
(74) Attorney, Agent, or Firm—John J Fry; Thomas M. Lundin

(57) ABSTRACT

In magnetic resonance imaging apparatus employing magnetic gradient fields in a phase-encode direction for spatially encoding excited MR active nuclei in a region of interest of a patient, in which a reduced number of readings in the phase-encode direction is taken, thereby creating an aliased reduced field of view image, a pair of r.f. receive coils is used together with sensitivity information concerning those coils in order to unfold the aliased image to produce a full image while taking advantage of the reduced time of collection of data. In accordance with the invention, the phase sensitivity pattern of each coil over the region of interest is different from that of the other coil.

18 Claims, 3 Drawing Sheets

DISTANCE FROM FoV CENTRE / PIXELS
(UPPER X AXIS $P_1$, LOWER $P_2$)

MAGNETIC RESONANCE IMAGING

BACKGROUND

This invention relates to magnetic resonance (MR) imaging.

The invention is particularly concerned with reduction in the time needed to collect data for imaging a region of interest of a patient.

For example, it is sometimes desired to view the progress of a contrast agent in the bloodstream through a region, in order to help distinguish between benign tumour, malignant tumour and unaffected tissue, and rapid imaging is required to monitor the flow of contrast agent to the various sites. A malignant tumour may require a greater supply of blood and could show up in this way.

A prior art magnetic resonance imaging apparatus is shown in FIG. 1. A patient 1 (shown in section) is slid axially into the bore 2 of a superconducting magnet 3, and the main magnetic field is set up along the axis of the bore, termed by convention the Z-direction. Magnetic field gradients are set up, for example, in the Z-direction, to confine the excitation of magnetic resonant (MR) active nuclei (typically hydrogen protons in water and fat tissue) to a particular slice in the Z-direction e.g. that illustrated in FIG. 1 and, in the horizontal X and the vertical Y directions as seen in FIG. 1, to encode the resonant MR nuclei in the plane of the slice. An r.f. transmit coil (not shown) applies an excitation pulse to excite the protons to resonance, and a pair of r.f. receive coils 4, 5 pick up relaxation signals emitted by the disturbed protons.

To encode/decode received signals in the Y-direction, the signals are detected in the presence of a magnetic field gradient, termed a read-out gradient, to enable different positions of relaxing nuclei to correspond to different precession frequencies of those nuclei about the direction of the main magnetic field due to the influence of the gradient. The data is digitised, and so for each r.f. excitation pulse, a series of digital data points are collected, and these are mapped into a spatial frequency domain known as K-space (FIG. 2). Each r.f. pulse permits at least one column of digital data points to be collected.

To encode/decode the received signals in the X-direction, after each r.f. pulse has been transmitted and before data is collected with the read-out gradient applied, a magnetic field gradient in the X-direction is turned on and off. This is done for a series of magnitudes of magnetic field gradients in the X-direction, one r.f. pulse typically corresponding to a different magnitude of gradient in the X-direction.

On the K-space matrix shown in FIG. 2, the columns of data points correspond to r.f. pulses followed by different magnitudes of phase-encode gradients.

The field of view imaged by the magnetic resonance imaging apparatus depends on the spacing of the data points in the phase-encode and read-out directions, and the resolution of the image depends on how far the points extend in each direction e.g. how large the maximum phase-encode gradient is.

The signals received from the r.f. receiver coils 4, 5 are subject to a two dimensional fast Fourier Transform in Fourier Transform processors 6, 7, to produce pixelated images which are stored in image memories 8, 9.

A slice image is shown in FIG. 3. For the purposes of explanation, the symbols of a circle, a square and a triangle have been illustrated in both the object 2 and the image in FIG. 3. FIG. 3 implies that the spacing of data points in the phase-encode gradient direction is sufficient to image the whole of the slice shown in FIG. 1.

Between each r.f. pulse, there is a certain minimum pulse repetition time, and the collection of data implied by FIGS. 2 and 3 may therefore take too long to permit flows of contrast agent to be adequately monitored.

One technique used to reduce the data collection time is to cut out, say, half the phase-encode steps e.g. by keeping the same maximum phase-encode gradient but omitting every other column of data. This would then halve the data collection time.

The spacing of the data points in the phase-encode direction would now have doubled, so that the field of view in the corresponding image domain would have halved. (The field of view in the read-out direction would remain the same because the number of data points collected during read-out would remain the same.) The imaged area would now cover little more than the square illustrated in FIG. 1. This is shown in FIG. 4. Unfortunately, MR signals from the circle and the triangle would still be picked up by each receive coil 4, 5, and the processing is such that these regions would be folded back over the square, with the circle and the triangle being interposed. This is a problem known as aliasing. Separate points $P_1$, $P_2$ in the object would be imaged at the same pixel in FIG. 4.

It is to enable the aliased image to be unfolded that two receive coils 4, 5 have been used. (Magnetic Resonance in Medicine 42:952–962(1999)—SENSE: Sensitivity Encoding For Fast MRI by Klaas P Pruessmann, Markus Weiger, Markus B Scheidegger and Peter Boesiger). With the two receive coils and suitable processing, the benefit of a halved data collection time can be retained, but the image can be unfolded. This technique is referred to as SENSE (sensitivity encoding).

The response of coil 4 to MR signals from point $P_1$ is perhaps greater than its response to MR signals emanating from point $P_2$, and the position is perhaps the other way round with regard to the coil 5. Knowledge of the relative sensitivities of the coils 4, 5 can be used in the processor 10 to unfold the aliased image of FIG. 4 into an image having the pattern of FIG. 3, although with a lower signal-to-noise ratio because only half the data has been collected.

For example, coil 4 receives MR signals from both points $P_1$ and $P_2$, and the combined intensity of the resulting pixel stored in image memory 8 ($C_1$) depends on the sensitivity of the coil 4 to point $P_1$ ($S_{11}$) and the sensitivity of the coil 4 to point $P_2$ ($S_{12}$). The image memory 9 also has an intensity stored ($C_2$) corresponding to points $P_1$ and $P_2$ which depends on the sensitivity of coil 5 to $P_1$ ($S_{21}$) and on its sensitivity to $P_2$ ($S_{22}$). Thus, $$C_1 = S_{11}P_1 + S_{12}P_2$$
$$C_2 = S_{21}P_1 + S_{22}P_2$$

More generally (C)=(S).(P) where (C), (S) and (P) are matrices.

Provided the sensitivity terms are known, the intensity corresponding to each pixel $P_1$ and $P_2$ separately can be calculated in processor 10, for each pair of points of the image which are mapped onto the same pixel in the aliased image. The aliased image can then be unfolded and viewed in full on display 11.

To calibrate the coils 4, 5 requires a knowledge of the sensitivity of each coil at each point. Of course, the data collected at each image memory 8, 9 maps the sensitivity of each coil 4, 5 onto each pixel, but in a way which is clearly weighted by the intensity produced by each point of the object.

The paper referred to suggests collecting the sensitivity data using a third receive coil, in the form of a body coil, which has a uniform sensitivity over each part of the object.

However, when two such coils 4, 5 have been used to enable the aliased image to be unfolded, it is the amplitude of the signals received at the coils which has been used in order to generate their sensitivity profiles.

SUMMARY

The invention provides apparatus for magnetic resonance imaging, comprising means for creating magnetic field gradients in a phase-encode direction for spatially encoding excited MR active nuclei in a region of interest of a patient, means for receiving r.f. signals from the excited MR active nuclei, means for processing the spatially encoded r.f. receive signals to produce a spatial representation of the region of interest, the magnetic field gradient means being arranged to create a number of phase-encode gradients corresponding to a smaller field of view than the region of interest, the r.f. receive means including a pair of r.f. receive coils and processing means arranged to use the r.f. signals received from each coil together with sensitivity information for the coils to produce an unfolded version of the aliased data corresponding to the reduced field of view, wherein the phase sensitivity pattern of each coil over the region of interest is different from that of the other coil.

Previously the phase response of each of r.f. receive coils was not substantially different from each other.

The coils of the pair may optionally operate as a quadrature pair.

Further, additional pairs of receive coils may be provided.

DRAWINGS

Ways of carrying out the invention will now be described in greater detail, by way of example, with reference to the accompanying drawings, in which.

DESCRIPTION

Figure 1:
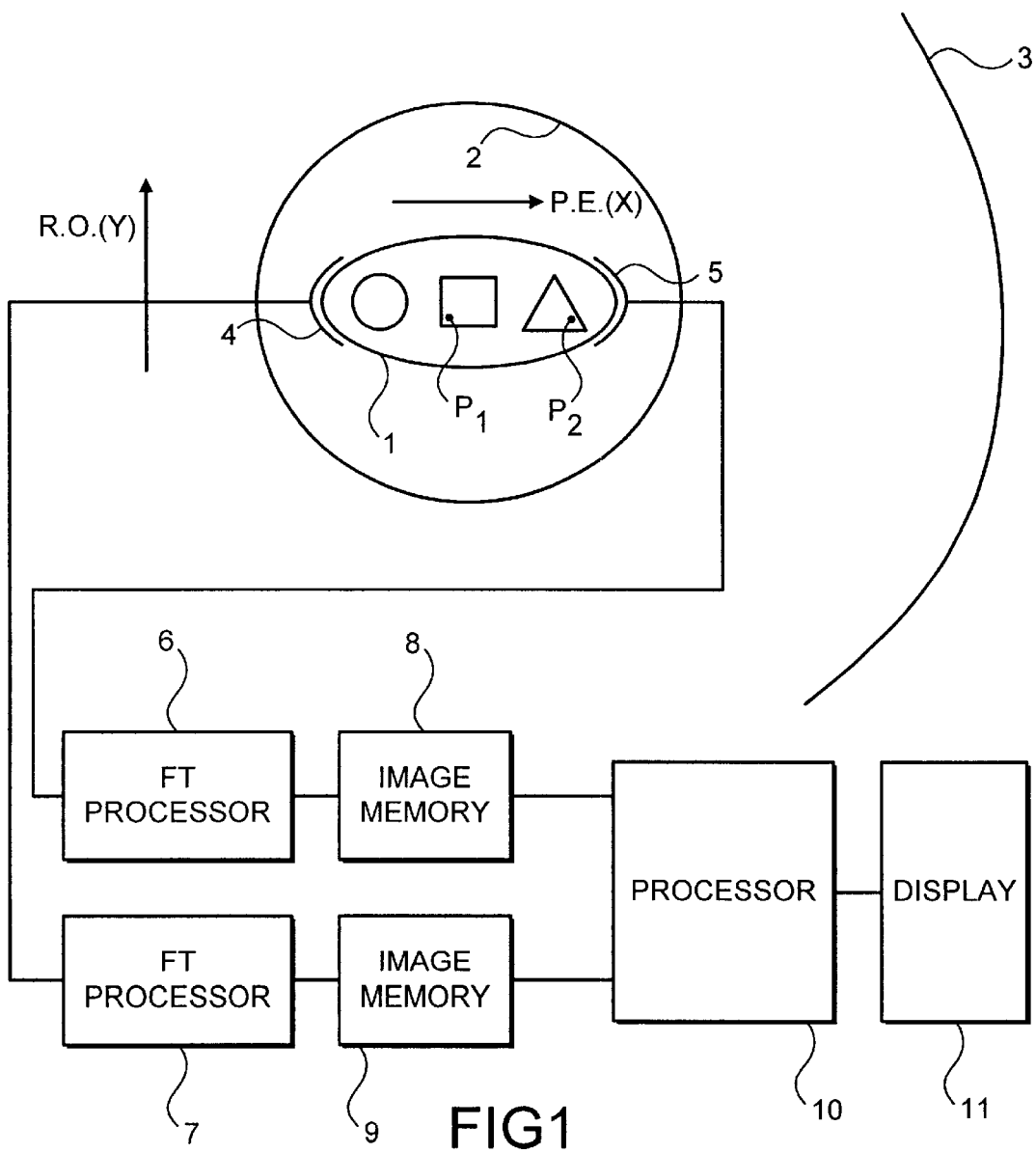
FIG. 1 is a partly axial sectional, partly block diagram representation, of prior art magnetic resonance imaging apparatus.
Figure 2:
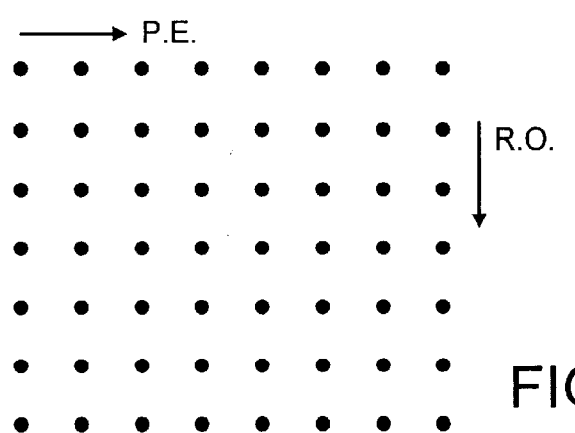
FIG. 2 is a representation of the data in K-space resulting from the signal picked up by each receive coil of the apparatus.
Figure 3:
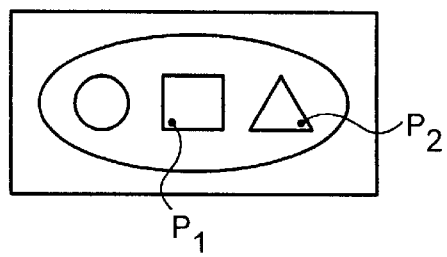
FIG. 3 is a representation of the image area which would be built up if a full number of phase-encode gradients were performed.
Figure 4:
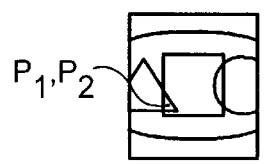
FIG. 4 is an image which would be built up if a reduced number of phase-encode gradients were to be performed.
Figure 5:
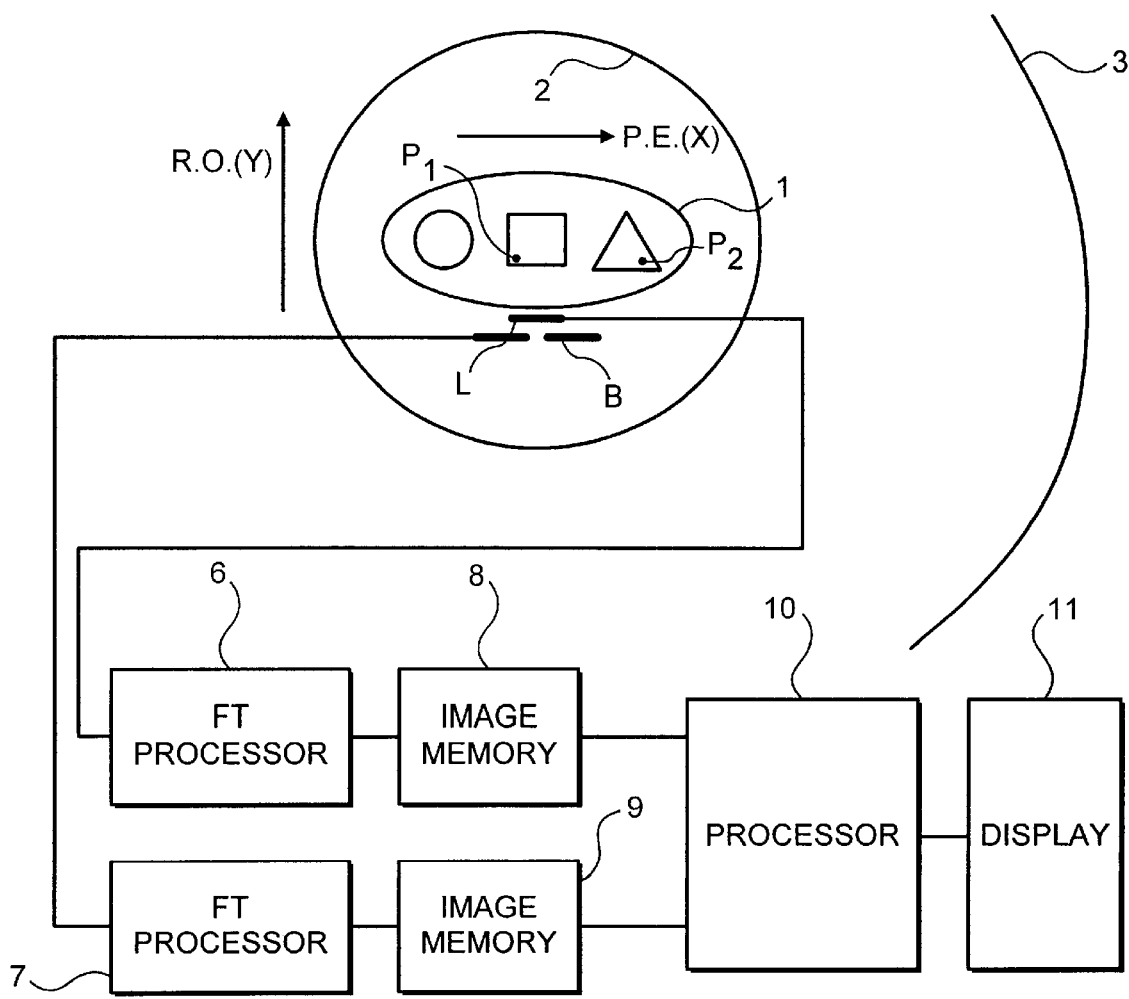
FIG. 5 is a partly axial sectional, partly block diagram, representation of magnetic resonance imaging apparatus according to the invention.

Referring to FIG. 5, the patient 1 is arranged in the bore 2 of a superconducting magnet 3 as for the prior apparatus, but in place of coils 4 and 5, coils L and B are used. These are connected to the same processing means as is shown in FIG. 1, and the unfolding of the aliased image produced by using a reduced number of phase-encode gradients takes place in the same way as described with reference to FIGS. 1 to 4.

Where the coils of the invention differ from those of the prior art, is that the coils 4 and 5 distinguish between various parts of the image basically on amplitude i.e. the largest response of coil 4 is to points immediately in the region of coil 4 and there is less response to points in the region of coil 5 and vice versa for coil 5. The phase response for the coils is roughly uniform over the region of interest.

Figure 6:
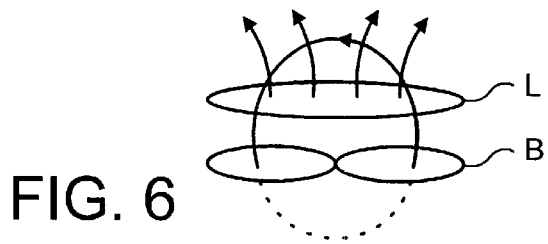
FIG. 6 is a perspective view of the receive coils of the invention showing lines of force from the coils.
Figure 7:
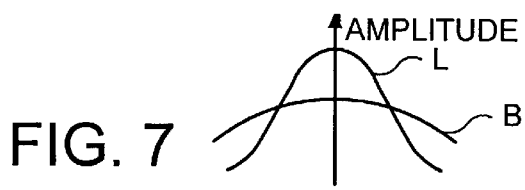
FIG. 7 shows the amplitude response of the coils.
Figure 8:
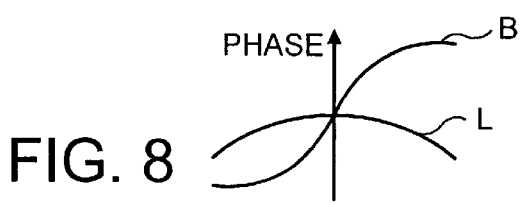
FIG. 8 shows the phase response of the coils.

Referring to FIGS. 6 to 8, it will be seen that the phase response of the coils L and B is significantly different from each other. Thus, the loop L responds to magnetic flux in the direction of the arrows shown extending from the loop, whereas the butterfly coil B responds to magnetic flux in the direction of the circular loop shown crossing the butterfly coil B. In a central region above the centre of the loop and the cross over region of the butterfly, the coils are actually responsive to orthogonal flux. The phase response of the coils is shown in FIG. 8, and the amplitude response in FIG. 7.

In an optional arrangement, the processing means could be changed so that the coils L and B operated, not with reduced phase-encode gradients as described, but in a manner with full phase-encode gradients, and with the coils L and B now operating as a quadrature receiver. This would enable the coil to produce increased signal for any particular region if desired.

In more detail, the receiver array of FIG. 5 consists of loop and a butterfly arranged as for a standard quadrature surface coil. The coils lie in the XZ plane, with $B_o$ directed along Z. Both coils have symmetric amplitude sensitivity distributions in the X-direction, and each has decreasing sensitivity with distance in Y. The loop coil has an approximately uniform phase structure in the X-direction, but the butterfly has a varying, anti-symmetric pattern.

Figure 9A:
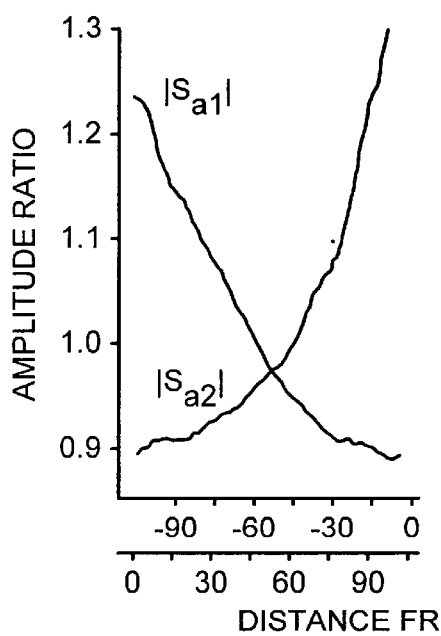
FIG. 9a shows the ratio $|S_{B\beta}|/|S_{L\beta}|$ and FIG. 9b the phase difference $S_\beta$ for the coils L, B plotted against the pixel locations $P_1$, $P_2$.
Figure 9B:
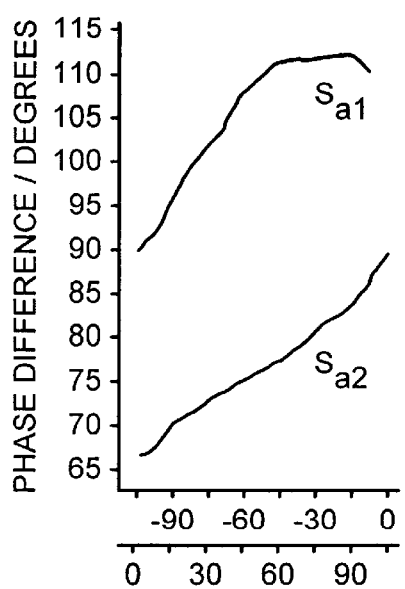

SENSE processing employs independent complex image data from each coil with pixel intensities $C_L$ (loop) and $C_B$ (butterfly). Reduced FoV data causes signals from distinct pixel locations, $P_1$ and $P_2$, to be superimposed so that $$C_L = S_{L1}P_1 + S_{L2}P_2 \tag{1a}$$

$$C_B = S_{B1}P_1 + S_{B2}P_2 \tag{1b}$$

where $S_{\alpha\beta}$ are the complex sensitivities of the respective coils at locations $P_\beta$. To unfold the data, equations 1 are inverted. However, the symmetries of the amplitude sensitivity patterns, FIG. 9a, $|S\alpha\beta|$, result in regions where $$|S_{L1}|/|S_{B1}| \approx |S_{L2}|/|S_{B2}| \tag{2}$$

so equation 1 becomes ill-conditioned resulting in poor separation of $P_1$ and $P_2$. Pixel intensities in the unfolded images then become critically dependent on the accuracy of $S\alpha\beta$, increased noise and systematic errors. For the loop/butterfly combination, the phase profiles have different symmetries, and equation 1 remains well conditioned.

In one example, experiments were performed on a Picker 0.5T Apollo system (Cleveland, Ohio). A loop 12×17 cm combined with a butterfly, 20×16 cm, was constructed and tuned to 21 MHz. The coils were connected to individual pre-amplifiers/receivers and actively decoupled during transmit. A gradient echo sequence (TR/TE 20/5 msec) with complex reconstruction was used to image doped water phantoms placed on top of the coil. Data was acquired over a 20 cm FoV in the coronal plane to directly measure the values of $S\alpha\beta$. To improve the signal-to-noise ratio (SNR) of the reference data a 32×64 data matrix, with 20NEX, zero filled to 256×256 was used. Data was also obtained with FoV/2 in the X-direction on a 256×128 matrix and reconstructed using SENSE to a 256×256 matrix.

The invention demonstrates a coil design in which phase structure plays a central role in SENSE. The use of phase as well as amplitude may be significant in generating efficient coil designs for a variety of applications. A notable feature of the current array is its spatially coincident coils, which can be used as a quadrature receiver for maximum SNR or for reduced acquisition time using SENSE. Arrays of quadrature coil pairs may prove particularly flexible, with options to maximise the speed-up factor, use an intermediate speed-up factor with local quadrature detection for increased SNR or standard imaging for maximum SNR. A wrap around geometry may allow well conditioned unfolding at more reduced FoV than equivalent numbers of simple loops.

While the magnet has been described as a superconducting magnet, it could be a resistive magnet, and need not be of the annular configuration but could be an open C or H configuration, and indeed, permanent magnets could be used.

Equally, while the use of a loop and butterfly coil have been disclosed, other configurations of coil having a different phase sensitivity pattern could be used.

While one pair of receive coils have been referred to, there is no restriction to two coils, and an array of more than two coils may be used.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

What is claimed is:

1. An apparatus for magnetic resonance imaging, comprising:
   means for generating a main magnetic field in an examination region;
   means for generating magnetic field gradients for spatially encoding MR active nuclei in a patient, the magnetic field gradient means being arranged to generate a plurality of phase-encode gradients corresponding to a smaller field of view than a region of interest within the examination region and resulting in an aliased image of the region of interest;
   means for exciting the spatially encoded MR active nuclei;
   means for receiving r.f. signals from the excited MR active nuclei, the r.f. receive means comprising a first r.f. receive coil and a second r.f. receive coil; and
   means for processing the spatially encoded r.f. receive signals to produce a spatial representation of the region of interest, the processing means arranged to use the r.f. signals received from the first and second r.f. receive coils together with sensitivity information for the first and second r.f. receive coils to produce an unfolded image of the aliased image, wherein the phase response over the region of interest of each of the r.f. receive coils is different from that of the other.

2. An apparatus as claimed in claim 1, wherein the first and second r.f. receive coils comprise a quadrature receive coil.

3. An apparatus as claimed in claim 2 wherein the quadrature receive coil is a surface coil.

4. An apparatus as claimed in claim 1 wherein the first r.f. receive coil is a loop coil and the second r.f. receive coil is a butterfly coil.

5. An apparatus as claimed in claim 4 wherein the first r.f. receive coil has a first phase profile and the second r.f. receive coil has a second phase profile and the first and second phase profiles have different symmetries.

6. An apparatus as claimed in claim 1 wherein the first r.f receive coil is also a transmit coil.

7. An apparatus as claimed in claim 1 wherein the second r.f. receive coil is also a transmit coil.

8. An apparatus as claimed in claim 1 wherein the first r.f. receive coil responds to a first magnetic flux comprising flux in a first direction and the second r.f. receive coil responds to a second magnetic flux comprising flux in a second direction, the second direction being orthogonal to the first direction.

9. An apparatus as claimed in claim 1 wherein the first and second r.f. receive coils are spatially coincident.

10. A method of magnetic resonance imaging, comprising:
    generating a main magnetic field in an examination region;
    generating magnetic field gradients for spatially encoding MR active nuclei in a patient, the magnetic field gradients including a plurality of phase-encode gradients corresponding to a smaller field of view than a region of interest within the examination region and resulting in an aliased image of the region of interest;
    exciting the spatially encoded MR active nuclei;
    receiving r.f. signals from the excited MR active nuclei, the step of receiving r.f. signals including the use of a first r.f. receive coil and a second r.f. receive coil; and
    processing the spatially encoded r.f. receive signals to produce a spatial representation of the region of interest, the step of processing including the use of the r.f. signals received from the first and second r.f. receive coils together with sensitivity information for the first and second r.f. receive coils to produce an unfolded image of the aliased image, wherein the phase response over the region of interest of each of the r.f. receive coils is different from that of the other.

11. A method as claimed in claim 10, wherein the first and second r.f. receive coils comprise a quadrature receive coil.

12. A method as claimed in claim 11 wherein the quadrature receive coil is a surface coil.

13. A method as claimed in claim 10 wherein the first r.f. receive coil is a loop coil and the second r.f. receive coil is a butterfly coil.

14. A method as claimed in claim 13 wherein the first r.f. receive coil has a first phase profile and the second r.f. receive coil has a second phase profile and the first and second phase profiles have different symmetries.

15. A method as claimed in claim 10 wherein the first r.f receive coil is also a transmit coil.

16. A method as claimed in claim 10 wherein the second r.f. receive coil is also a transmit coil.

17. A method as claimed in claim 10 wherein the first r.f. receive coil responds to a first magnetic flux comprising flux in a first direction and the second r.f. receive coil responds to a second magnetic flux comprising flux in a second direction, the second direction being orthogonal to the first direction.

18. A method as claimed in claim 10 wherein the first and second r.f. receive coils are spatially coincident.

* * * * *